(12) United States Patent
Wang et al.

(10) Patent No.: US 11,688,816 B1
(45) Date of Patent: Jun. 27, 2023

(54) ELECTRODE STRUCTURE OF BACK CONTACT CELL, BACK CONTACT CELL, BACK CONTACT CELL MODULE, AND BACK CONTACT CELL SYSTEM

(71) Applicant: Solarlab Aiko Europe GmbH, Freiburg (DE)

(72) Inventors: Yongqian Wang, Foshan (CN); Xinqiang Yang, Foshan (CN); Gang Chen, Foshan (CN)

(73) Assignee: SOLARLAB AIKO EUROPE GMBH, Freiburg (DE)

( * ) Notice: Subject to any disclaimer, the term of this patent is extended or adjusted under 35 U.S.C. 154(b) by 0 days.

(21) Appl. No.: 18/095,497

(22) Filed: Jan. 10, 2023

Related U.S. Application Data

(63) Continuation-in-part of application No. 17/743,492, filed on May 13, 2022, now Pat. No. 11,588,060.

(30) Foreign Application Priority Data

Feb. 24, 2022 (CN) .......................... 202210168681.7

(51) Int. Cl.
*H01L 31/0224* (2006.01)
*H01L 31/02* (2006.01)

(52) U.S. Cl.
CPC .. *H01L 31/022441* (2013.01); *H01L 31/0201* (2013.01); *H01L 31/022433* (2013.01)

(58) Field of Classification Search
CPC ................................ H01L 31/022425–022441
See application file for complete search history.

(56) References Cited

U.S. PATENT DOCUMENTS

2011/0017263 A1 * 1/2011 Gibson ........... H01L 31/022433
136/246

FOREIGN PATENT DOCUMENTS

| CN | 108010970 A | * | 5/2018 | |
| EP | 3416196 A1 | * | 12/2018 | ....... H01L 31/02008 |
| JP | 2007281044 A | * | 10/2007 | ..... H01L 31/022441 |
| WO | WO-2011058653 A1 | * | 5/2011 | ..... H01L 31/022425 |

OTHER PUBLICATIONS

English machine translation of Murakami (JP 2007-281044) published Oct. 25, 2007.*
English machine translation of Miura et al. (WO 2011/058653) published May 19, 2011.*
English machine translation of Tong et al. (CN 108010970) published May 8, 2018.*

* cited by examiner

*Primary Examiner* — Christina Chern
(74) *Attorney, Agent, or Firm* — Matthias Scholl P.C.; Matthias Scholl

(57) ABSTRACT

The disclosure provides an electrode structure of a back contact cell, a back contact cell, a back contact cell module, and a back contact cell system. The electrode structure includes: first fingers, configured to collect a first polarity region; second fingers, configured to collect a second polarity region; a first busbar, disposed on a side of the back contact cell close to a first edge and connected to the first fingers; first pad points; and first connection electrodes, respectively connected to the first busbar and the first pad points. A distance between each of the first pad points and the first edge is greater than a distance between the first busbar and the first edge. The electrode structure can improve the reliability, reduce the costs, increase the product yield, and ensure excellent photoelectric conversion efficiency.

13 Claims, 7 Drawing Sheets

ELECTRODE STRUCTURE OF BACK CONTACT CELL, BACK CONTACT CELL, BACK CONTACT CELL MODULE, AND BACK CONTACT CELL SYSTEM

CROSS-REFERENCE TO RELATED APPLICATIONS

This application is a continuation-in-part of U.S. application Ser. No. 17/743,492 filed May 13, 2022, now pending, and claims the benefit of Chinese Patent Application No. 202210168681.7 filed Feb. 24, 2022. The contents of all of the aforementioned applications, including any intervening amendments thereto, are incorporated herein by reference. Inquiries from the public to applicants or assignees concerning this document or the related applications should be directed to: Matthias Scholl P.C., Attn.: Dr. Matthias Scholl Esq., 245 First Street, 18th Floor, Cambridge, Mass. 02142.

BACKGROUND

The disclosure belongs to the technical field of solar cells, and more particularly to an electrode structure of a back contact cell, a back contact cell, a back contact cell module, and a back contact cell system.

A solar cell is a semiconductor device capable of converting light energy to electric energy. Relatively low production costs and relatively high energy conversion efficiency have always been the goals pursued by the photovoltaic industry. For a conventional solar cell, an emitter contact electrode and a base contact electrode of the solar cell are respectively located on two opposite sides of the solar cell. A front side of the cell is a light-receiving surface. The coverage of a front metal emitter contact electrode inevitably causes part of incident sunlight to be reflected and blocked by a metal electrode, resulting in part of optical loss. A coverage area of a front metal electrode of an ordinary crystalline silicon solar cell is about 7%. Therefore, energy conversion efficiency of the cell may be directly enhanced by reducing the front coverage of the metal electrode.

In view of the above situation, a back contact solar cell is introduced. A back contact solar cell is a cell in which an emitter and a base contact electrode are both disposed on the back side (a non-light-receiving surface) of the cell. A light-receiving surface of the cell is not shielded by any metal electrode, thereby effectively increasing the short-circuit current of the cell. In addition, relatively wide metal fingers are allowed to be disposed on the back side to reduce a serial resistance, thereby increasing the fill factor. Moreover, the cell with the front not shielded not only has high conversion efficiency, but also looks more beautiful. In addition, a module of an all back-contact electrode is easy to assemble.

For the back contact solar cell, an electrode pattern design is a core technology of the cell. Three electrode pattern designs of the existing back contact solar cell are as follows.

1. Referring to FIG. 1, electrodes having opposite polarities are printed with insulation paste 3 to be insulated, but electrodes having a same polarity are exposed, and then pad points 1 and a bus bar 2 are printed to cause the electrodes having the same polarity to be in contact with each other. However, the insulation paste 3 cannot withstand a high temperature, and the pad points 1 and the bus bar 2 are formed by post-printing. Therefore, only low-temperature paste may be selected for the pad points 1 and the bus bar 2, thereby increasing the costs, and the use of low-temperature paste has the problem of reliability. In order to form good insulation, the insulation paste 3 is about 30 μm in height. In order to avoid disconnection, heights of the pad points 1 and the bus bar 2 are required to be greater than 30 μm. This may lead to high paste consumption, which further increases the costs. In addition, the insulation paste 3 and some paste have problems such as poor adhesion, which poses a great challenge on mass production.

2. Referring to FIG. 2, a finger 4 is disconnected at pad points 5 having opposite polarities and a busbar 6, while the pad points 5 at the edge and the busbar 6 are located at the farthest edge of a silicon wafer. The pad points 5 and the bus bar 6 are on the edge of the silicon wafer. During the manufacturing process of a module, a ribbon is also required to cover the edge of the silicon wafer. A large number of microcracks exist on the edge of the silicon wafer, which cause stress concentration during the welding process of the ribbon, resulting in the problem of cracks, reducing the yield and the reliability of the module.

3. Referring to FIG. 3, a finger 7 is disconnected at pad points 8 having opposite polarities and a bus bar 9, the outer pad points 8 and the busbar 9 are at a certain distance from the farthest edge of the silicon wafer, and the outer pad points 8 and an outer periphery of the bus bar 9 are disposed to have a same polarity. Although the third design solves the problems existing in the first design and second design, photo-generated electron-hole pairs are required to be diffused into a region having an opposite polarity to form effective collection. For the third design, the photo-generated electrons and holes on the outer side are required to cross a distance by a level of mm or even cm to reach the region having the opposite polarity. A recombination loss of a long-distance diffusion process causes the short-circuit current to drop, increases series resistance, and causes loss of the fill factor, resulting in very poor photoelectric conversion performance. Therefore, it has always been one of the key research problems for those skilled in the art to design an electrode structure of a back contact cell, a back contact cell, a back contact cell module, and a back contact cell system to solve the above problems.

SUMMARY

The disclosure provides an electrode structure of a back contact cell, to solve technical problems of high costs, low reliability, and poor photoelectric conversion performance of the existing back contact solar cell.

An electrode structure of a back contact cell is provided; the back contact cell comprises a first polarity region, a second polarity region, and a first edge, and the electrode structure comprises:

a plurality of first fingers, configured to collect the first polarity region;

a plurality of second fingers, configured to collect the second polarity region;

a first busbar, disposed on a side of the back contact cell close to the first edge and connected to the first fingers;

a plurality of first pad points; and a plurality of first connection electrodes, respectively connected to the first busbar and the first pad points, where a distance between each of the first pad points and the first edge is greater than a distance between the first busbar and the first edge.

In a class of this embodiment, the second fingers comprise first bent fingers between the first busbar and the first pad points, the first bent fingers are respectively bent toward the first busbar and the first pad points, and are in contact with neither the first busbar nor the first pad points, or the first bent fingers are bent toward the first busbar and are not in contact with the first busbar, or the first bent fingers are bent toward the first pad points and are not in contact with the first pad points.

In a class of this embodiment, each of the first bent fingers passes through at least one of the first fingers.

In a class of this embodiment, a center line of each of the first connection electrodes and a center line of each of the first pad points are not on a same straight line.

In a class of this embodiment, the electrode structure further comprises third fingers respectively connected to the first busbar and the first pad points. The third fingers are disposed adjacent to the first connection electrodes, and a width of each of the third fingers is less than a width of each of the first connection electrodes.

In a class of this embodiment, each of the second fingers is covered with a first insulating material in a region aligned with a vertical center line of each of the first pad points.

In a class of this embodiment, the distance between the first busbar and the first edge ranges from 0.01 mm to 3 mm.

In a class of this embodiment, the distance between each of the first pad points and the first edge ranges from 1 mm to 20 mm.

In a class of this embodiment, the electrode structure further comprises:

a second busbar, disposed on a side of the back contact cell close to a second edge and connected to the second fingers, where the second edge is opposite to the first edge;

a plurality of second pad points; and a plurality of second connection electrodes, connecting to the second busbar and the second pad points, where a distance between each of the second pad points and the second edge is greater than a distance between the second busbar and the second edge.

In a class of this embodiment, the first fingers comprise second bent fingers between the second busbar and the second pad points, the second bent fingers are respectively bent toward the second busbar and the second pad points and are in contact with neither the second busbar nor the second pad points, or the second bent fingers are bent toward the second busbar and are not in contact with the second busbar, or the second bent fingers are bent toward the second pad points and are not in contact with the second pad points.

In a class of this embodiment, each of the second bent fingers passes through at least one of the second fingers.

In a class of this embodiment, a center line of each of the second connection electrodes and a center line of each of the second pad points are on a same straight line.

In a class of this embodiment, the electrode structure further comprises fourth fingers, connecting to the second busbar and the second pad points. The fourth fingers are disposed adjacent to the second connection electrodes, and a width of each of the fourth fingers is less than a width of each of the second connection electrodes.

In a class of this embodiment, each of the first fingers is covered with a second insulating material in a region aligned with a vertical center line of each of the second pad points.

In a class of this embodiment, the distance between the second busbar and the second edge ranges from 0.01 mm to 3 mm.

In a class of this embodiment, the distance between each of the second pad points and the second edge ranges from 1 mm to 20 mm.

The disclosure further provides a back contact cell. The back contact cell comprises the electrode structure described above, and the electrode structure is disposed on a back surface (a non-light-receiving surface) of the back contact cell.

The disclosure further provides a back contact cell module. The back contact cell module comprises the back contact cell described above.

The disclosure further provides a back contact cell system. The back contact cell system comprises the back contact cell module described above.

The beneficial effect of the disclosure is that the electrode structure comprises the first fingers, the second fingers, the first busbar, the first pad points, and the first connection electrodes respectively connected to the first busbar and the first pad points, so as to realize collection of currents. There is no need to print insulation paste in a large area of the electrode structure. The first pad points and the first busbar are not simultaneously disposed on the first edge of the back contact cell, and the photo-generated electrons and holes are not required to cross a long distance to reach the region having the opposite polarity. In this way, the electrode structure can improve the reliability, reduce the costs, increase the product yield, and ensure excellent photoelectric conversion efficiency.

DETAILED DESCRIPTION

To make objectives, technical solutions, and advantages of the disclosure clearer and more comprehensible, the following further describes the disclosure in detail with reference to the accompanying drawings and embodiments. It should be understood that the embodiments herein are provided for describing the disclosure and not intended to limit the disclosure.

The disclosure provides an electrode structure of a back contact cell. The electrode structure comprises first fingers, second fingers, a first busbar, first pad points, and first connection electrodes respectively connected to the first busbar and the first pad points. The first fingers collect currents in a first polarity region, and the currents flow to the first busbar through the first pad points and the first connection electrodes, thereby realizing the collection of the currents. There is no need to print insulation paste in a large area of the electrode structure. The first pad points and the first busbar are not simultaneously disposed on the first edge of the back contact cell, and the photo-generated electrons and holes are not required to cross a long distance to reach the region having an opposite polarity. In this way, the electrode structure can improve the reliability, reduce the costs, increase the product yield, and ensure excellent photoelectric conversion efficiency.

Embodiment 1

Figure 4:
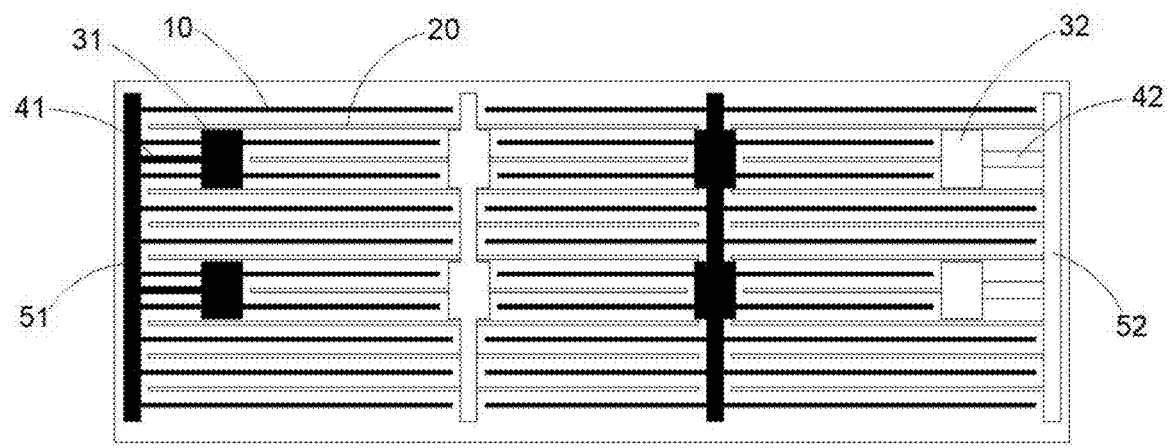
FIG. 4 is a schematic diagram of an electrode structure according to an embodiment of the disclosure.

Referring to FIG. 4, Embodiment 1 provides an electrode structure of a back contact cell. The electrode structure comprises:

first fingers 10, configured to collect a first polarity region;

second fingers 20, configured to collect a second polarity region;

a first busbar 51, disposed on a side of the back contact cell close to a first edge and connected to the first fingers 10;

first pad points 31; and first connection electrodes 41, respectively connected to the first busbar 51 and the first pad points 31.

A distance between each of the first pad points 31 and the first edge is greater than a distance between the first busbar 51 and the first edge.

In an embodiment of the disclosure, the first finger 10 is configured to collect currents of the first polarity region, and the second finger 20 is configured to collect currents of the second polarity region. If the polarities of the first finger 10 and the second finger 20 are opposite, the polarities of the first polarity region and the second polarity region are opposite as well. For example, if the first finger 10 is a positive electrode finger and is configured to collect positive electrode currents in a positive electrode region, then the second finger 20 is a negative electrode finger and is configured to collect negative electrode currents in a negative electrode region. Alternatively, if the first finger 10 is the negative electrode finger and is configured to collect negative electrode currents in the negative electrode region, then the second finger 20 is the positive electrode finger and is configured to collect positive electrode currents in the positive electrode region. The positive electrode finger is disposed in a P-type doped region of the back contact cell, and the negative electrode finger is disposed in an N-type doped region of the back contact cell.

Referring to FIG. 4 to FIG. 10, for the convenience of identification, the polarities of the first fingers 10 in a blackened part is the same, the polarities of the second fingers 20 in an unprinted part are the same, and the polarities of the first fingers 10 and the second fingers 20 are opposite. On the other hand, the first pad points 31, the first connection electrodes 41, and the first busbar 51 in the blackened part have the same polarity as the first fingers 10.

The first fingers 10 and the second fingers 20 are alternately disposed, and the first fingers 10 and the second fingers 20 are all parallel to an edge line of the back contact cell. For example, referring to FIG. 4, the first fingers 10 and the second fingers 20 are alternately disposed in a vertical direction, and the first fingers 10 and the second fingers 20 are both parallel to an upper edge line and a lower edge line of the back contact cell. The back contact cell is substantially in a rectangular shape. The back contact cell that is substantially in the rectangular shape may be, for example, in a square shape, or may be in another rectangular shape, and may have standard corners, cut corners, or rounded corners. The back contact cell is designed according to actual production requirements, which is not specifically limited herein. Quantities of the first fingers 10 and the second fingers 20 of the back contact cell are determined according to an actual size of the back contact cell and widths of the first fingers 10 and the second fingers 20 and a distance therebetween, which are not specifically limited herein.

Further, the first finger 10 or the second finger 20 is an aluminum finger, a silver finger, a copper finger, or a silver-coated copper finger. It may be understood that, in this embodiment of the disclosure, a same metal type or different metal types of fingers may be selected as the first finger 10 and the second finger 20 of the back contact cell. For example, the aluminum finger is selected as the first finger 10 and the second finger 20, or the aluminum finger is selected as the first finger 10, and the silver finger is selected as the second finger 20. When the first finger 10 or the second finger 20 is the aluminum finger or the silver finger, the first finger or the second finger is printed on the doped region of the back contact cell by silk-screen printing. When the first finger 10 or the second finger 20 is the copper finger, the first finger or the second finger is plated on the doped region of the back contact cell by electroplating, evaporation, or the like.

The distance between each of the first pad points 31 and the first edge is greater than the distance between the first busbar 51 and the first edge. For example, referring to FIG. 4, a distance between a leftmost side of the first pad points 31 and an edge of a leftmost side of the back contact cell is greater than a distance between a leftmost side of the first busbar 51 and the edge of the leftmost side of the back contact cell.

In this embodiment, the distance between the first busbar 51 and the first edge ranges from 0.01 mm to 3 mm, which herein is the distance between an edge of the first busbar 51 close to the first edge and the first edge. For example, the distance between the first busbar 51 and the first edge is 0.05 mm, 1 mm, 2 mm, 3 mm, or other parameter values from 0.01 mm to 3 mm. The distance between each of the first pad points 31 and the first edge ranges from 1 mm to 20 mm, which herein is the distance between an edge of the first pad point 31 close to the first edge and the first edge. For example, the distance between the first pad point 31 and the first edge is 1 mm, 5 mm, 10 mm, 20 mm, or other parameter values from 1 mm to 20 mm, but the distance between the first pad point 31 and the first edge is greater than the distance between the first busbar 51 and the first edge.

In this embodiment of the disclosure, the first pad point 31 is disposed away from the first busbar 51, and the connection between the first pad point 31 and the first busbar 51 is realized by using the first connection electrode 41. However, the first busbar 51 is disposed on the first edge of the back contact cell, and the first pad point 31 is disposed away from the first edge of the back contact cell. During the current collection, the first finger 10 collects the currents of the first polarity region, then transmits the collected currents to the first pad point 31, and then transmits the collected currents from the first pad point 31 to the first busbar 51 through the first connection electrode 41 to complete the collection of the currents. Compared with the first electrode pattern design in the background art, there is no need to print the insulation paste in a large area of the electrode structure of the disclosure, and high-temperature paste may be selected for the first pad point 31 and the first busbar 51, thereby reducing the costs and ensuring the reliability. In addition, the heights of the first pad point 31 and the first busbar 51 are not required to be too high, so that the paste consumption is reduced. Moreover, since there is no need to print the insulation paste in a large area, the problem of poor adhesion with some paste will not occur, thereby reducing the difficulty of mass production. Compared with the second electrode pattern design in the background art, the first busbar 51 is located at the first edge of the back contact cell, and the first pad point 31 is away from the first edge of the back contact cell, so as to avoid stress concentration in the welding process, thereby improving the yield of the module and improving the reliability of the module. Compared with the third electrode pattern design in the background art, the photo-generated electrons and holes are not required to cross a long distance to reach the region having the opposite polarity, to collect the currents, thereby fully ensuring relatively high photoelectric conversion efficiency.

Embodiment 2

On the basis of Embodiment 1, the second finger 20 of Embodiment 2 comprises first bent fingers between the first busbar 51 and the first pad points 31, the first bent fingers are respectively bent toward the first busbar 51 and the first pad points 31 and are in contact with neither the first busbar 51 nor the first pad points 31, or the first bent fingers are bent toward the first busbar 51 and are not in contact with the first busbar 51, or the first bent fingers are bent toward the first pad points 31 and are not in contact with the first pad points 31.

Figure 5:
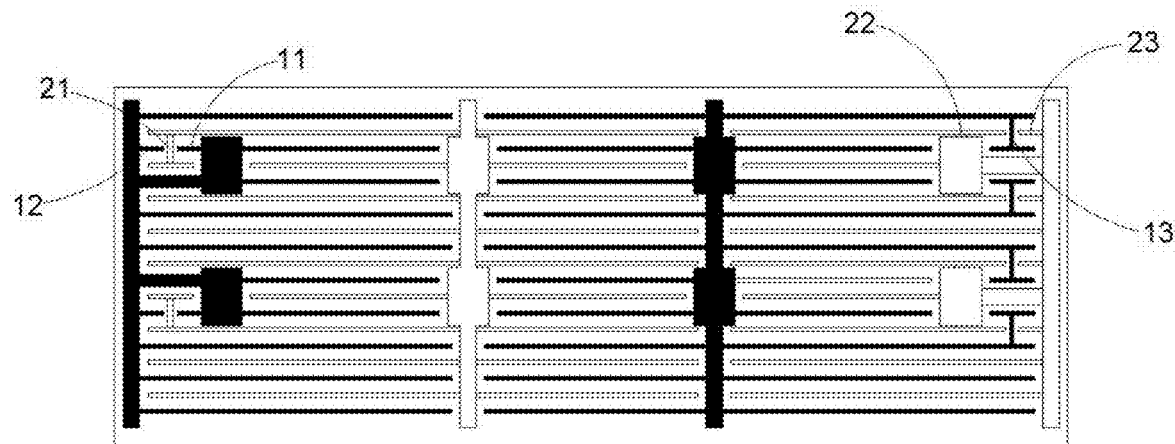
FIG. 5 is a schematic diagram of an electrode structure provided with bent fingers respectively extending toward pad points and a busbar according to an embodiment of the disclosure.

Referring to FIG. 5, the first bent fingers are defined as first bent sub-fingers 21. The first fingers 10 comprise first pad point connection fingers 11 connected to the first pad points 31 and first busbar connection fingers 12 connected to the first busbar 51. The first pad point connection fingers 11 are disposed adjacent to the first busbar connection fingers 12, and a gap is formed therebetween. The first bent sub-fingers 21 pass through the gap, are respectively bent toward the first busbar 51 and the first pad points 31, and are in contact with neither the first busbar 51 nor the first pad points 31. In other implementations, the first pad point connection fingers 11 and/or the first busbar connection fingers 12 may be omitted. However, through arrangement of the first pad point connection fingers 11 and/or the first busbar connection fingers 12, the fingers may be disposed more uniformly, to cause the current collection in a small region to be implemented.

Figure 6:
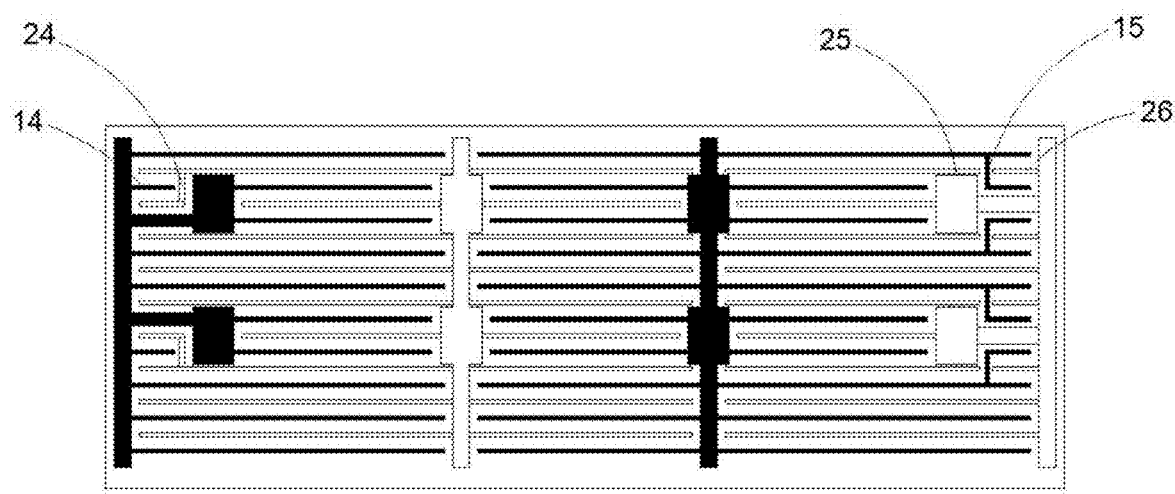
FIG. 6 is a schematic diagram of an electrode structure provided with bent fingers extending toward the busbar according to an embodiment of the disclosure.

Referring to FIG. 6, the first bent fingers are defined as second bent sub-fingers 24. The first fingers 10 comprise second busbar connection fingers 14 connected to the first busbar 51, and a gap is formed between the second busbar connection fingers 14 and the first pad points 31. The second bent sub-fingers 24 pass through the gap, are bent toward the first busbar 51, and are not in contact with the first busbar 51. In other implementations, the pad point connection finger may be added, so as to achieve a more uniform arrangement of the fingers and cause the current collection in a small region to be implemented.

Figure 7:
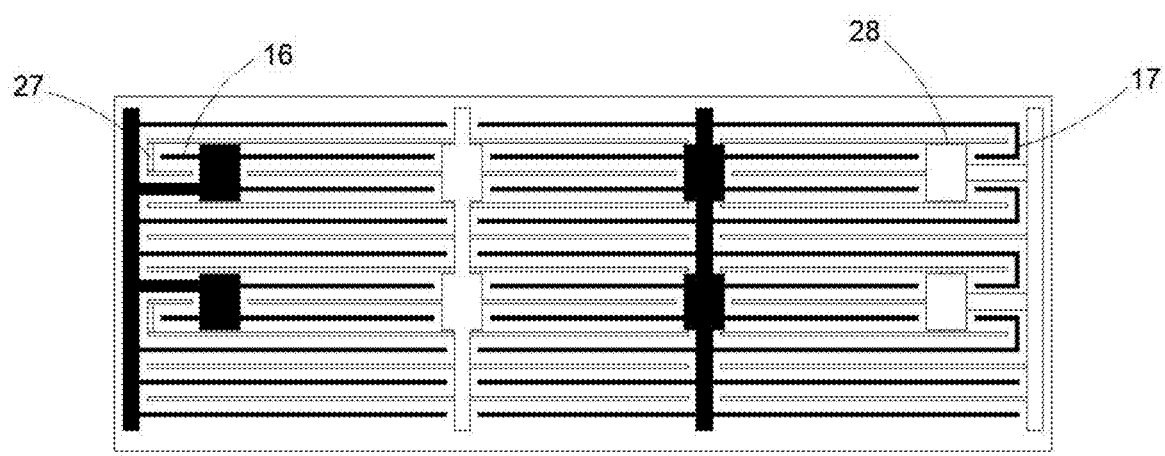
FIG. 7 is a schematic diagram of an electrode structure provided with bent fingers extending toward pad points according to an embodiment of the disclosure.
Figure 8:
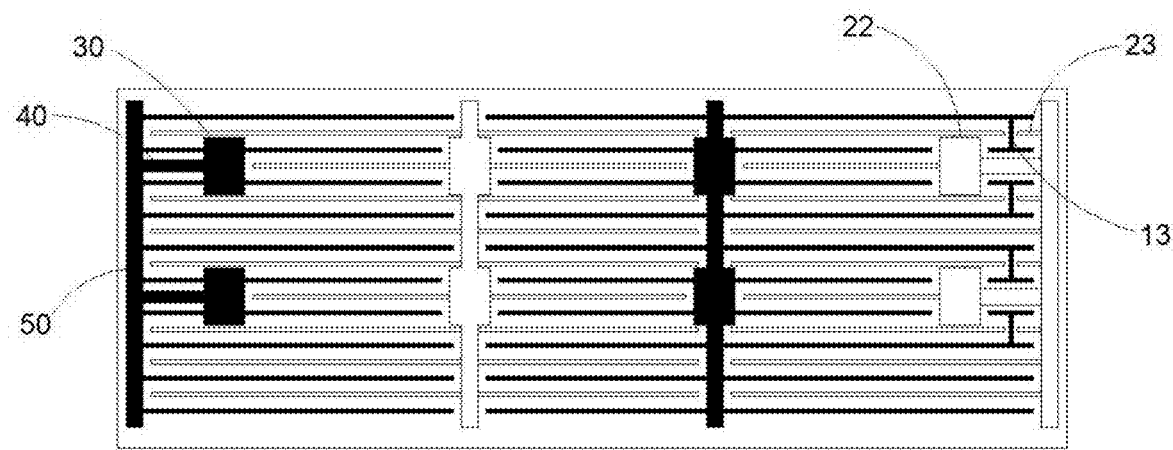
FIG. 8 is a schematic diagram of the electrode structure having different finger designs on edges of two ends of the back contact cell according to an embodiment of the disclosure.

Referring to FIG. 7, the first bent fingers are defined as third bent sub-fingers 27. The first fingers 10 comprise second pad point connection fingers 16 connected to the first pad points 31. A gap is formed between the second pad point connection fingers 16 and the first busbar 51, and the third bent sub-fingers 27 pass through the gap, are bent toward the first pad points 31, and are not in contact with the first pad points 31. In other implementations, the busbar connection finger may be added, so as to achieve a more uniform arrangement of the fingers and cause the current collection in a small region to be implemented.

In this embodiment of the disclosure, a length of the first bent finger is determined according to a size of an available region. The first bent fingers form divergent extension, so as to make full use of the region where the currents can be collected, thereby further improving the capability of current collection.

Further, based on the above implementations, each of the first bent fingers passes through at least one of the first fingers 10. A plurality of first fingers 10 may be disposed in the region between or near the first pad points 31 and the first busbar 51, and a plurality of gaps are formed by arranging the first fingers 10. In this way, the first bent fingers may pass through the gaps in sequence, and then form divergent extension after passing through each of the gaps, thereby further improving the capability of current collection.

Embodiment 3

Referring to FIG. 5 to FIG. 7, on the basis of Embodiment 2, a center line of each of the first connection electrodes 41 and a center line of each of the first pad points 31 in Embodiment 3 are not on the same straight line.

In this embodiment of the disclosure, the center line of the first pad point 31 is located on a setting line of the second fingers 20, and the polarities of the first pad points 31 and the second fingers 20 are opposite. For example, the first pad point 31 has a positive polarity, and the second finger 20 has a negative polarity. Therefore, the center line of the first connection electrode 41 is disposed offset from the center line of the first pad point 31. That is, the center line of the first connection electrode 41 is disposed offset from the setting line of the second finger 20, so that the center line of the first connection electrode 41 may be disposed on the setting line of the first finger 10. The polarities of the first connection electrode 41 and the first finger 10 are the same, thereby achieving a more uniform distribution of fingers having opposite polarities in the region adjacent to the first pad point 31, and further improving the capability of current collection.

Embodiment 4

Figure 9:
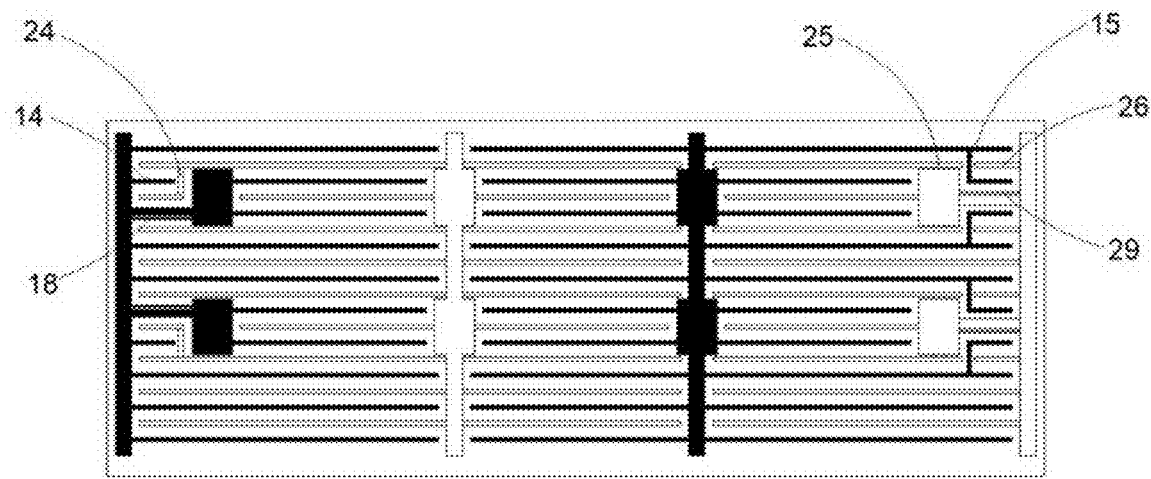
FIG. 9 is a schematic diagram of an electrode structure provided with third fingers and fourth fingers according to an embodiment of the disclosure.

Referring to FIG. 9, on the basis of Embodiment 2, the electrode structure of Embodiment 4 further comprises a third finger 18 respectively connected to the first busbar 51 and the first pad point 31. The third finger 18 is disposed adjacent to the first connection electrode 41, and a width of the third finger 18 is less than a width of the first connection electrode 41.

In this embodiment of the disclosure, under normal circumstances, the first connection electrode 41 is not in contact with a substrate of the back contact cell. At this point, the photo-generated electrons and holes in the region where the first connection electrode 41 is located cannot be effectively collected. Therefore, the third finger 18 is disposed in the region adjacent to the first connection electrode 41, and the third finger 18 may be in contact with the substrate, thereby further improving the capability of current collection.

Embodiment 5

Figure 10:
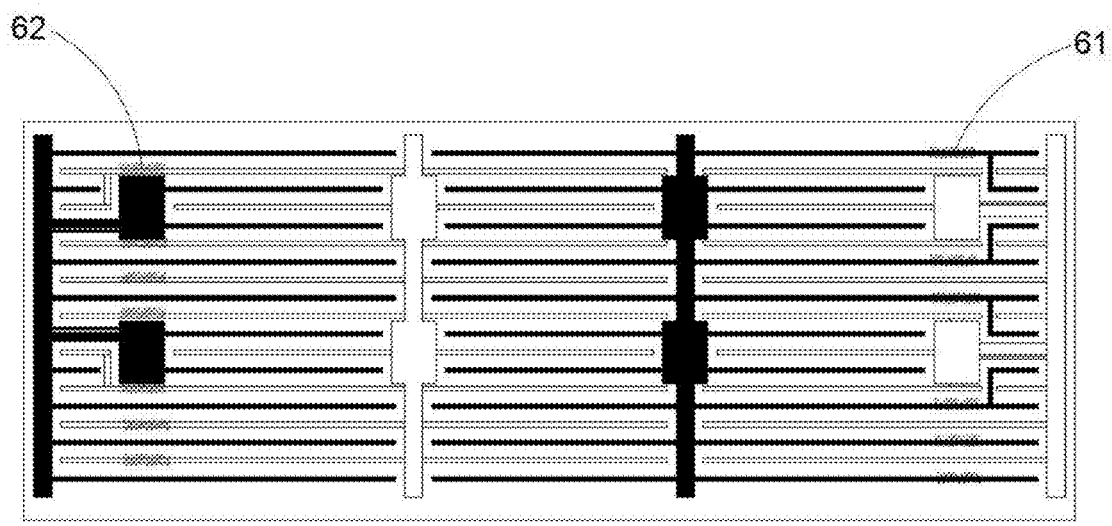
FIG. 10 is a schematic diagram of an electrode structure provided with a first insulating material and a second insulating material according to an embodiment of the disclosure.

Referring to FIG. 10, on the basis of Embodiment 1, the second finger 20 of Embodiment 5 is covered with a first insulating material 62 in a partial region located on a center line of the first pad point 31.

The first insulating material 62 may be covered with the insulation paste, where only the second finger 20 is covered with the insulation paste in the partial region located on the center line of the first pad point 31, which will not increase product costs. Certainly, the first insulating material 62 may also adopt other implementations, as long as the purpose of insulation can be achieved.

During the welding of the ribbon, under the insulating effect of the first insulating material 62, the second finger 20 may be prevented from coming into contact with the ribbon in the partial region located on the center line of the first pad point 31, thereby effectively avoiding occurrence of short circuits. In addition, the first insulating material 62 is made after the first pad point 31 and the first busbar 51 are formed, and does not affect the selection of electrode materials for the first pad point 31 and the first busbar 51.

Embodiment 6

As shown in FIG. 4, on the basis of Embodiment 1, the electrode structure of Embodiment 6 further comprises:

a second busbar 52, disposed on a side of the back contact cell close to a second edge and connected to the second finger 20, where the second edge is opposite to the first edge;

a plurality of second pad points 32; and a second connection electrode 42, connecting to the second busbar 52 and the second pad points 32.

A distance between each of the second pad points 32 and the second edge is greater than a distance between the second busbar 52 and the second edge.

Referring to FIG. 4, the first edge is a leftmost side of the back contact cell, and the second edge is a rightmost side of the back contact cell. A plurality of pad points is also disposed between the first pad point 31 and the second pad point 32. The pad points may be disposed on the same straight line as the busbar having a same polarity.

The distance between each of the second pad points 32 and the second edge is greater than the distance between the second busbar 52 and the second edge. For example, referring to FIG. 4, a distance between a leftmost side of the second pad points 32 and an edge of the leftmost side of the back contact cell is greater than a distance between a leftmost side of the second busbar 52 and an edge of the leftmost side of the back contact cell.

In this embodiment, the distance between the second busbar 52 and the second edge ranges from 0.01 mm to 3 mm, which herein is the distance between an edge of the second busbar 52 close to the second edge and the second edge. For example, the distance between the second busbar 52 and the second edge is 0.05 mm, 1 mm, 2 mm, 3 mm, or other parameter values from 0.01 mm to 3 mm. The distance between each of the second pad points 32 and the second edge ranges from 1 mm to 20 mm, which herein is the distance between an edge of the second pad point 32 close to the second edge and the second edge. For example, the distance between each of the second pad points 32 and the second edge is 1 mm, 5 mm, 10 mm, 20 mm, or other parameter values from 1 mm to 20 mm, but the distance between each of the second pad points 32 and the second edge is greater than the distance between the second busbar 52 and the second edge.

In this embodiment of the disclosure, the second pad point 32 is disposed away from the second busbar 52, and the connection between the second pad point 32 and the second busbar 52 is realized by using the second connection electrode 42. However, the second busbar 52 is disposed on the second edge of the back contact cell, and the second pad point 32 is disposed away from the second edge of the back contact cell. During the current collection, the second finger 20 collects the currents of the second polarity region, then transmits the collected currents to the second pad point 32, and then transmits the collected currents from the second pad point 32 to the second busbar 52 through the second connection electrode 42 to complete the collection of the currents. Pad points, busbars, and connection electrodes respectively connected to the pad points and the busbars are disposed on edges of two ends of the back contact cell. Compared with the first electrode pattern design in the background art, there is no need to print the insulation paste in a large area, and high-temperature paste may be selected for the pad points and the busbars, thereby reducing the costs and ensuring the reliability. In addition, the heights of the pad point and the busbar are not required to be too high, so that the paste consumption is reduced. Moreover, since there is no need to print the insulation paste in a large area, the problem of poor adhesion with some paste will not occur, thereby reducing the difficulty of mass production. Compared with the second electrode pattern design in the background art, the busbars are located at the edge of the back contact cell, and the pad points are away from the edge of the back contact cell, so as to avoid stress concentration in the welding process, thereby improving the yield of the module and improving the reliability of the module. Compared with the third electrode pattern design in the background art, the photo-generated electrons and holes are not required to cross a long distance to reach the region having the opposite polarity, to collect the currents, thereby fully ensuring relatively high photoelectric conversion efficiency.

Embodiment 7

On the basis of Embodiment 6, the first finger 10 of the Embodiment 7 comprises second bent fingers located between the second busbar 52 and the second pad points 32, the second bent fingers are respectively bent toward the second busbar 52 and the second pad points 32 and are not in contact with the second busbar 52 and the second pad points 32, or the second bent fingers are bent toward the second busbar 52 and are not in contact with the second busbar 52, or the second bent fingers are bent toward the second pad point 32 and are not in contact with the second pad points 32.

Referring to FIG. 5, the second bent fingers are defined as fourth bent sub-fingers 13. The second fingers 20 comprise third pad point connection fingers 22 connected to the second pad points 32 and third busbar connection fingers 23 connected to the second busbar 52. The third pad point connection fingers 22 are disposed adjacent to the third busbar connection fingers 23, and a gap is formed therebetween. The fourth bent sub-fingers 13 pass through the gap, are respectively bent toward the second busbar 52 and the second pad points 32, and are in contact with neither the second busbar 52 nor the second pad points 32. In other implementations, the third pad point connection finger 22 and/or the third busbar connection finger 23 may be omitted. However, through arrangement of the third pad point connection finger 22 and/or the third busbar connection finger 23, the fingers may be disposed more uniformly, to cause the current collection in a small region to be implemented.

Referring to FIG. 6, the second bent fingers are defined as fifth bent sub-fingers 15. The second fingers 20 comprise fourth pad point connection fingers 25 connected to the second pad points 32 and fourth busbar connection fingers 26 connected to the second busbar 52. The fourth pad point connection fingers 25 are disposed adjacent to the fourth busbar connection fingers 26, and a gap is formed therebetween. The fifth bent sub-fingers 15 pass through the gap, are respectively bent toward the second busbar 52, and are not in contact with the second busbar 52. In other implementations, the fourth pad point connection fingers 25 and/or the fourth busbar connection fingers 26 may be omitted. However, through arrangement of the fourth pad point connection fingers 25 and/or the fourth busbar connection fingers 26, the fingers may be disposed more uniformly, to cause the current collection in a small region to be implemented.

Referring to FIG. 7, the second bent fingers are defined as sixth bent sub-fingers 17. The second fingers 20 comprise fifth pad point connection fingers 28 connected to the second pad points 32. A gap is formed between the fifth pad point connection fingers 28 and the second busbar 52, and the sixth bent sub-fingers 17 pass through the gap, are bent toward the second pad point 32, and are not in contact with the second pad points 32. In other implementations, the busbar connection finger may be added, so as to achieve a more uniform arrangement of the fingers and cause the current collection in a small region to be implemented.

In this embodiment of the disclosure, a length of the second bent finger is determined according to a size of an available region. The second bent fingers form divergent extension, so as to make full use of the region where the currents can be collected, thereby further improving the capability of current collection.

Further, based on the above implementations, each of the second bent fingers passes through at least one of the second fingers 20. A plurality of second fingers 20 may be disposed in the region between or near the second pad point 32 and the second busbar 52, and a plurality of gaps are formed by arranging the second fingers 20. In this way, the second bent fingers may pass through the gaps in sequence, and then form divergent extension after passing through each of the gaps, thereby further improving the capability of current collection.

In combination with Embodiment 2, the arrangement of the first bent finger and the second bent finger can be disposed on the edges of two ends of the back contact cell in different manners, and the arrangement mode of the first bent finger and the second bent finger may be selected according to an actual situation. For example, referring to FIG. 8, the first edge of the back contact cell is not provided with the first bent finger, and the second edge of the back contact cell is provided with the second bent finger. The second bent fingers are respectively bent toward the second busbar 52 and the second pad point 32.

Embodiment 8

Referring to FIG. 5 to FIG. 7, on the basis of Embodiment 7 a center line of the second connection electrode 42 and a center line of the second pad point 32 in Embodiment 8 are on a same straight line.

In this embodiment of the disclosure, the center line of the second pad point 32 is located on a setting line of the second finger 20, and the second pad point 32 has a same polarity as the second finger 20. For example, the second pad point 32 has a negative polarity, and the second finger 20 has a negative polarity. Therefore, the center line of the second connection electrode 42 and the center line of the second pad point 32 are disposed on the same straight line, so as to dispose the center line of the second connection electrode 42 on the setting line of the second finger 20. The second connection electrode 42 has the same polarity as the second finger 20, thereby achieving a more uniform distribution of fingers having opposite polarities in the region adjacent to the second pad point 32, and further improving the capability of current collection.

Embodiment 9

On the basis of Embodiment 7, the electrode structure of Embodiment 9 further comprises a fourth finger 29 respectively connected to the second busbar 52 and the second pad point 32. The fourth finger 29 is disposed adjacent to the second connection electrode 42, and a width of the fourth finger 29 is less than a width of the second connection electrode 42.

In this embodiment of the disclosure, under normal circumstances, the second connection electrode 42 is not in contact with a substrate of the back contact cell. At this point, the photo-generated electrons and holes in the region where the second connection electrode 42 is located cannot be effectively collected. Therefore, the fourth finger 29 is disposed in the region adjacent to the second connection electrode 42, and the fourth finger 29 may be in contact with the substrate, thereby further improving the capability of current collection.

Embodiment 10

On the basis of Embodiment 6, the first finger 10 of Embodiment 10 is covered with a second insulating material 61 in a partial region located on a center line of the second pad point 32.

The second insulating material 61 may be covered with the insulation paste, where only the first finger 10 is covered with the insulation paste in the partial region located on the center line of the second pad point 32, which will not increase product costs. Certainly, the second insulating material 61 may also adopt other implementations, as long as the purpose of insulation can be achieved.

During the welding of the ribbon, under the insulating effect of the second insulating material 61, the first finger 10 may be prevented from coming into contact with the ribbon in the partial region located on the center line of the second pad point 32, thereby effectively avoiding occurrence of short circuits. In addition, the second insulating material 61 is made after the second pad point 32 and the second busbar 52 are formed, and does not affect the selection of electrode materials for the second pad point 32 and the second busbar.

Based on Embodiment 1 to Embodiment 10 described above, the modeling calculation is performed herein.

Figure 1:
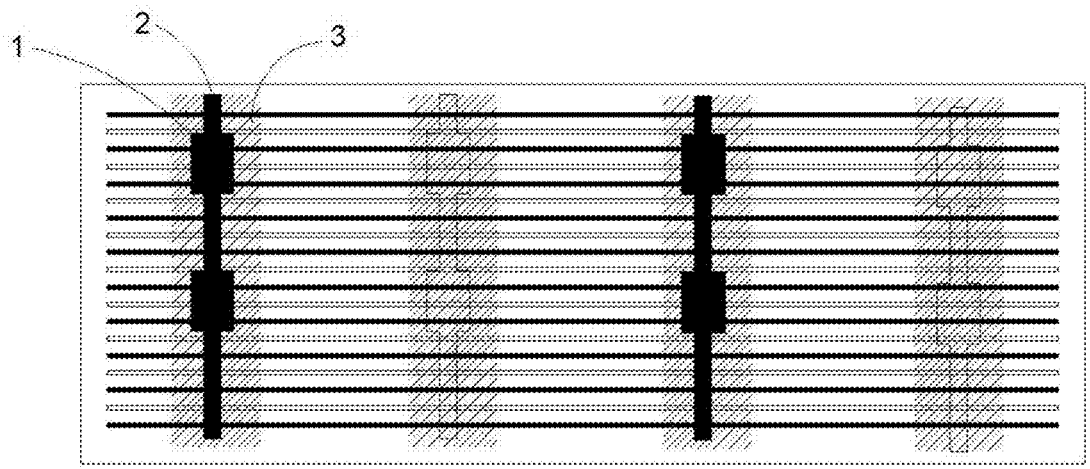
FIG. 1 is a schematic diagram of a first electrode pattern design of the prior art.
Figure 2:
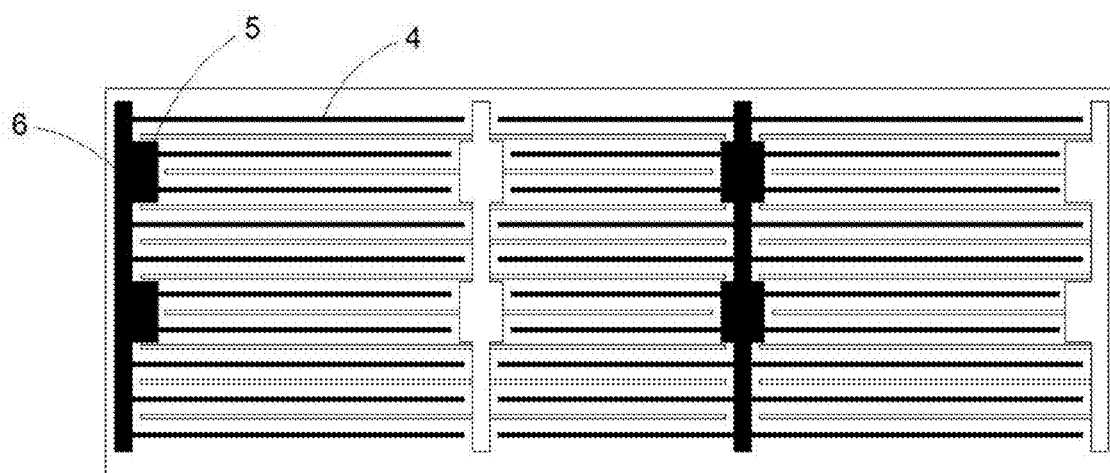
FIG. 2 is a schematic diagram of a second electrode pattern design of the prior art.
Figure 11:
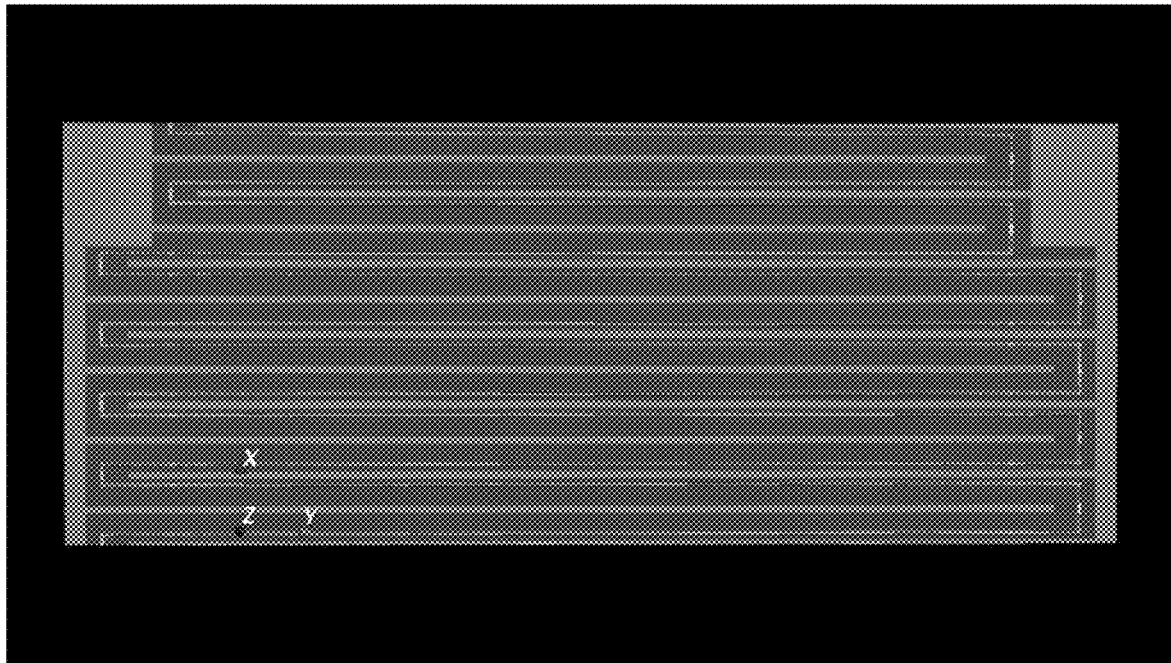
FIG. 11 is an edge model diagram of a second electrode pattern design of the prior art.
Figure 12:
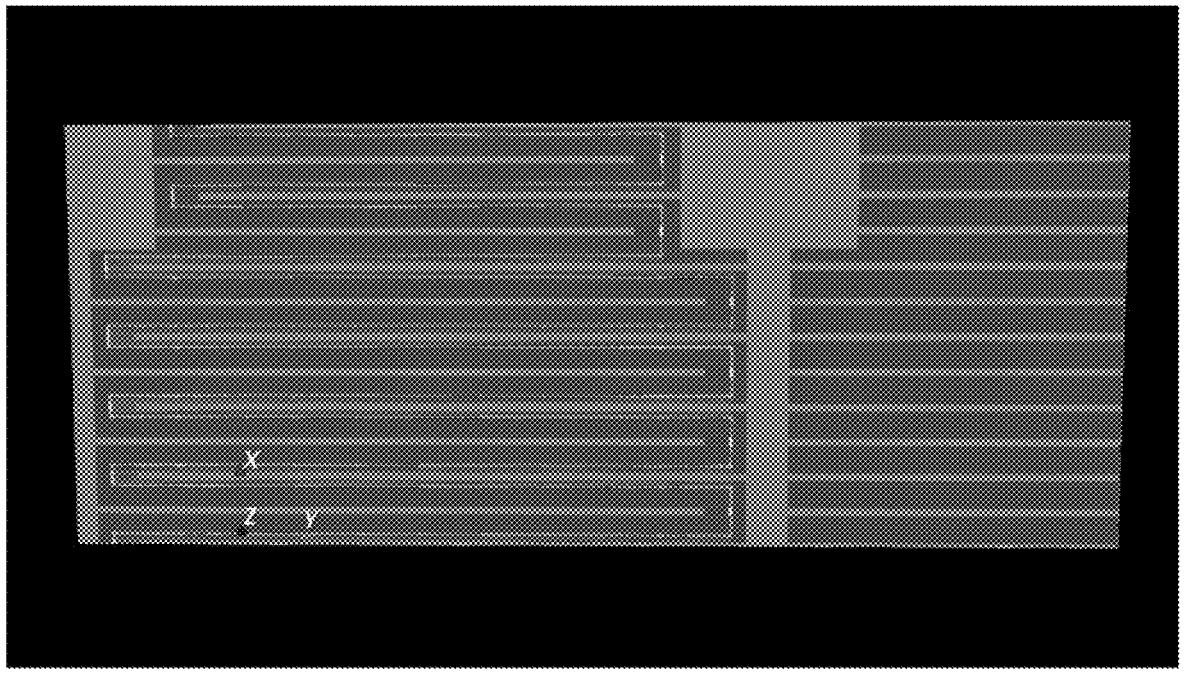
FIG. 12 is an edge model diagram of a third electrode pattern design of the prior art.
Figure 13:
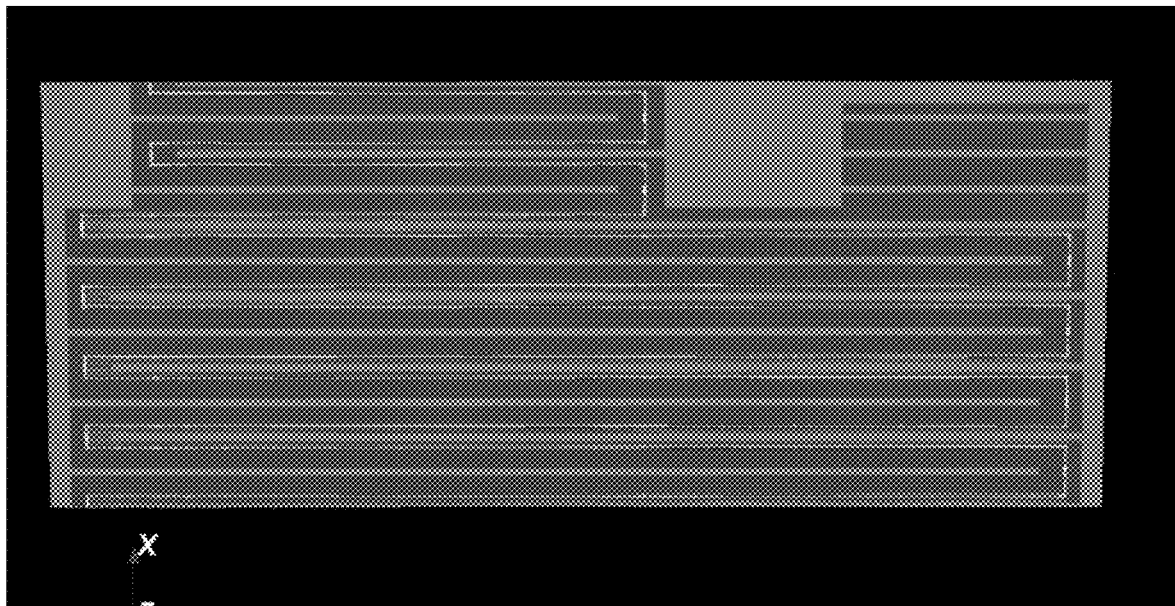
FIG. 13 is an edge model diagram based on the electrode structure of FIG. 4.
Figure 14:
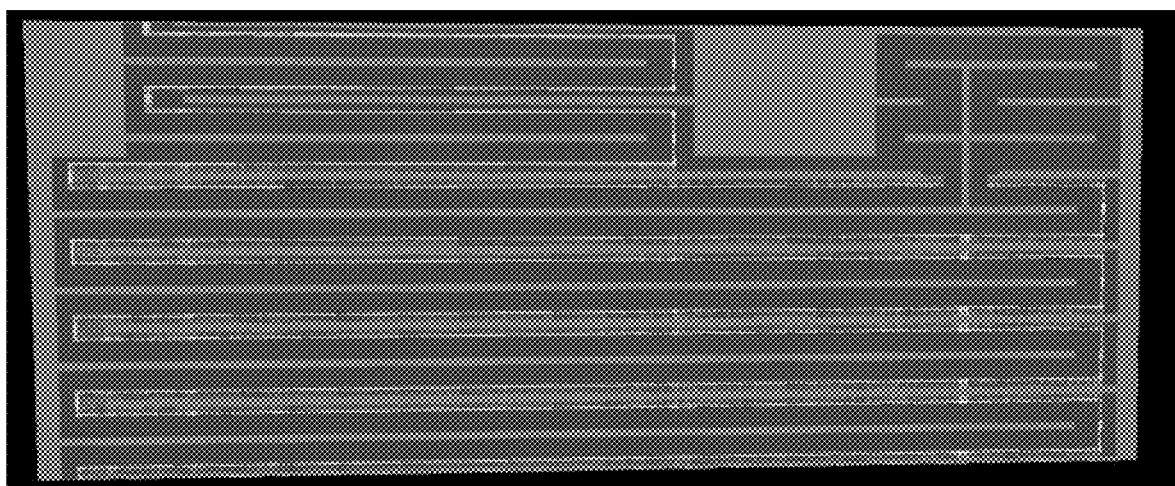
FIG. 14 is an edge model diagram based on the electrode structure of FIG. 5 to FIG. 9.

FIG. 11 shows an edge model diagram based on the electrode structure of FIG. 2. FIG. 12 shows an edge model diagram based on the electrode structure of FIG. 3. FIG. 13 shows an edge model diagram based on the electrode structure of FIG. 4. FIG. 14 shows an edge model diagram based on the electrode structure of FIG. 5 to FIG. 9.

Figure 3:
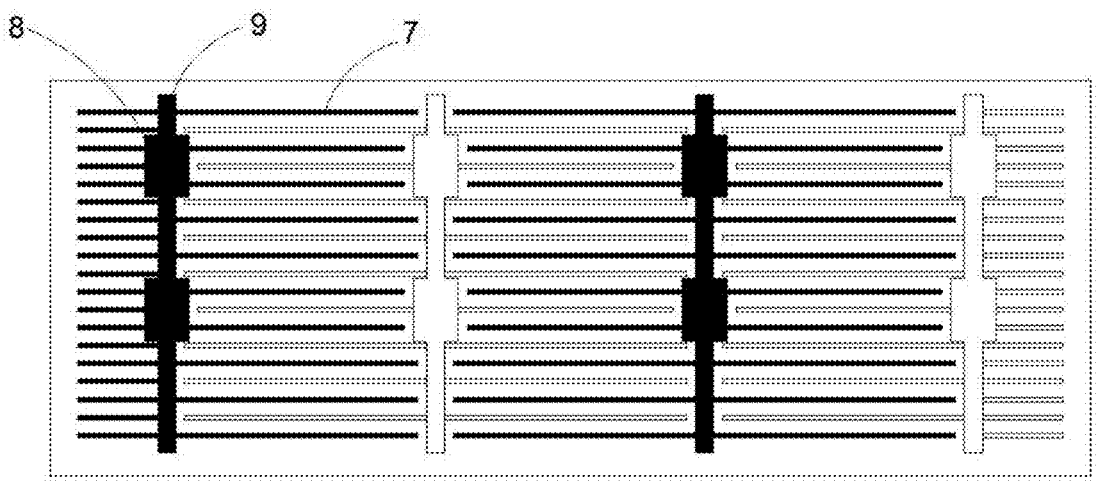
FIG. 3 is a schematic diagram of a third electrode pattern design of the prior art.

The following table can be made:

| Scheme | $V_{oc}$ (mV) | $J_{sc}$ (mA/cm$^2$) | FF (%) | Conversion efficiency (%) | Efficiency loss value (%) assuming that an edge region accounts for 10% of a total area |
|---|---|---|---|---|---|
| Scheme of FIG. 2 | 744.1 | 42.28 | 83.24 | 26.18 | |
| Scheme of FIG. 3 | 743.8 | 30.56 | 80.48 | 18.30 | 0.789 |
| Scheme of FIG. 4 | 744.2 | 40.82 | 82.26 | 24.99 | 0.120 |
| Schemes of FIG. 5 to FIG. 9 | 744.5 | 42.19 | 83.26 | 26.15 | 0.003 |

The cell conversion efficiency is a key performance evaluation index for the back contact cell. Higher cell conversion efficiency leads to better performance, and every 0.1% increase is a breakthrough for the industry. It can be seen that the scheme of FIG. 3 is adopted, the problem of module yield and reliability is solved, but the performance is greatly reduced by 0.789%. If the scheme of FIG. 4 of the disclosure is adopted, the efficiency loss is reduced to 0.12% in a case that the module yield and reliability are solved. If the optimization scheme of FIG. 5 to FIG. 9 of the disclosure is adopted, the efficiency loss may be reduced to 0.003%. At present, the conversion efficiency test repeatability of the back contact cell is about ±0.05%, and the efficiency loss is too low to be monitored and can be ignored.

Embodiment 11

Embodiment 11 provides a back contact cell. The back contact cell comprises the electrode structure described in Embodiment 1 to Embodiment 10, and the electrode structure is disposed on a backlight surface of the back contact cell.

In the electrode structure provided in this embodiment of the disclosure, the first pad point 31 is disposed away from the first busbar 51, and the connection between the first pad point 31 and the first busbar 51 is realized by using the first connection electrode 41. However, the first busbar 51 is disposed on the first edge of the back contact cell, and the first pad point 31 is disposed away from the first edge of the back contact cell. During the current collection, the first finger 10 collects the currents of the first polarity region, then transmits the collected currents to the first pad point 31, and then transmits the collected currents from the first pad point 31 to the first busbar 51 through the first connection electrode 41 to complete the collection of the currents. Compared with the first electrode pattern design in the background art, there is no need to print the insulation paste in a large area of the electrode structure of the disclosure, and high-temperature paste may be selected for the first pad point 31 and the first busbar 51, thereby reducing the costs and ensuring the reliability. In addition, the heights of the first pad point 31 and the first busbar 51 are not required to be too high, so that the paste consumption is reduced. Moreover, since there is no need to print the insulation paste in a large area, the problem of poor adhesion with some paste will not occur, thereby reducing the difficulty of mass production. Compared with the second electrode pattern design in the background art, the first busbar 51 is located at the first edge of the back contact cell, and the first pad point 31 is away from the first edge of the back contact cell, so as to avoid stress concentration in the welding process, thereby improving the yield of the module and improving the reliability of the module. Compared with the third electrode pattern design in the background art, the photo-generated electrons and holes are not required to cross a long distance to reach the region having the opposite polarity, to collect the currents, thereby fully ensuring relatively high photoelectric conversion efficiency.

Embodiment 12

Embodiment 12 provides a back contact cell module. The back contact cell module comprises the back contact cell described in Embodiment 12.

In the electrode structure provided in this embodiment of the disclosure, the first pad point 31 is disposed away from the first busbar 51, and the connection between the first pad point 31 and the first busbar 51 is realized by using the first connection electrode 41. However, the first busbar 51 is disposed on the first edge of the back contact cell, and the first pad point 31 is disposed away from the first edge of the back contact cell. During the current collection, the first finger 10 collects the currents of the first polarity region, then transmits the collected currents to the first pad point 31, and then transmits the collected currents from the first pad point 31 to the first busbar 51 through the first connection electrode 41 to complete the collection of the currents. Compared with the first electrode pattern design in the background art, there is no need to print the insulation paste in a large area of the electrode structure of the disclosure, and high-temperature paste may be selected for the first pad point 31 and the first busbar 51, thereby reducing the costs and ensuring the reliability. In addition, the heights of the first pad point 31 and the first busbar 51 are not required to be too high, so that the paste consumption is reduced. Moreover, since there is no need to print the insulation paste in a large area, the problem of poor adhesion with some paste will not occur, thereby reducing the difficulty of mass production. Compared with the second electrode pattern design in the background art, the first busbar 51 is located at the first edge of the back contact cell, and the first pad point 31 is away from the first edge of the back contact cell, so as to avoid stress concentration in the welding process, thereby improving the yield of the module and improving the reliability of the module. Compared with the third electrode pattern design in the background art, the photo-generated electrons and holes are not required to cross a long distance to reach the region having the opposite polarity, to collect the currents, thereby fully ensuring relatively high photoelectric conversion efficiency.

Embodiment 13

Embodiment 13 provides a back contact cell system. The back contact cell system comprises the back contact cell module described in Embodiment 12.

In the electrode structure provided in this embodiment of the disclosure, the first pad point 31 is disposed away from the first busbar 51, and the connection between the first pad point 31 and the first busbar 51 is realized by using the first connection electrode 41. However, the first busbar 51 is disposed on the first edge of the back contact cell, and the first pad point 31 is disposed away from the first edge of the back contact cell. During the current collection, the first finger 10 collects the currents of the first polarity region, then transmits the collected currents to the first pad point 31, and then transmits the collected currents from the first pad point 31 to the first busbar 51 through the first connection electrode 41 to complete the collection of the currents. Compared with the first electrode pattern design in the background art, there is no need to print the insulation paste in a large area of the electrode structure of the disclosure, and high-temperature paste may be selected for the first pad point 31 and the first busbar 51, thereby reducing the costs and ensuring the reliability. In addition, the heights of the first pad point 31 and the first busbar 51 are not required to be too high, so that the paste consumption is reduced. Moreover, since there is no need to print the insulation paste in a large area, the problem of poor adhesion with some paste will not occur, thereby reducing the difficulty of mass production. Compared with the second electrode pattern design in the background art, the first busbar 51 is located at the first edge of the back contact cell, and the first pad point 31 is away from the first edge of the back contact cell, so as to avoid stress concentration in the welding process, thereby improving the yield of the module and improving the reliability of the module. Compared with the third electrode pattern design in the background art, the photo-generated electrons and holes are not required to cross a long distance to reach the region having an opposite polarity, to collect the currents, thereby fully ensuring relatively high photoelectric conversion efficiency.

The foregoing descriptions are merely exemplary embodiments of the disclosure, but are not intended to limit the disclosure. Any modification, equivalent replacement, or improvement made without departing from the spirit and principle of the disclosure should fall within the protection scope of the disclosure.

What is claimed is:

1. An electrode structure of a back contact cell, the back contact cell comprising a first polarity region, a second polarity region, and a first edge, the electrode structure comprising:
    a plurality of first fingers, configured to collect the first polarity region;
    a plurality of second fingers, configured to collect the second polarity region;
    a first busbar, disposed on a side of the back contact cell close to the first edge and connected to the plurality of first fingers;
    a plurality of first pad points;
    a plurality of first connection electrodes, respectively connected to the first busbar and the first pad points, wherein a distance between each of the first pad points and the first edge is greater than a distance between the first busbar and the first edge;
    a second busbar, disposed on a side of the back contact cell close to a second edge of the back contact cell and connected to the plurality of second fingers, wherein the second edge is opposite to the first edge;
    a plurality of second pad points; and
    a plurality of second connection electrodes, connecting to the second busbar and the plurality of second pad points, wherein a distance between each of the plurality of second pad points and the second edge is greater than a distance between the second busbar and the second edge,
    wherein the plurality of first fingers comprise bent fingers between the second busbar and the plurality of second pad points, the bent fingers are respectively bent toward the second busbar and the plurality of second pad points, and are in contact with neither the second busbar nor the plurality of second pad points, or the bent fingers are bent toward the second busbar and are not in contact with the second busbar, or the bent fingers are bent toward the plurality of second pad points and are not in contact with the plurality of second pad points.

2. The electrode structure of claim 1, wherein each of the second fingers is covered with a first insulating material in a region aligned with a vertical center line of each of the first pad points.

3. The electrode structure of claim 1, wherein the distance between the first busbar and the first edge ranges from 0.01 mm to 3 mm.

4. The electrode structure of claim 3, wherein the distance between each of the first pad points and the first edge ranges from 1 mm to 20 mm.

5. The electrode structure of claim 1 wherein each of the bent fingers passes through at least one of the plurality of second fingers.

6. The electrode structure of claim 1, wherein a center line of each of the second connection electrodes and a center line of each of the plurality of second pad points are on a same straight line.

7. The electrode structure of claim 1, further comprising third fingers, connecting to the second busbar and the plurality of second pad points, wherein the third fingers are disposed adjacent to the plurality of second connection electrodes, and a width of each of the third fingers is less than a width of each of the plurality of second connection electrodes.

8. The electrode structure of claim 1, wherein each of the plurality of first fingers is covered with a second insulating material in a region aligned with a vertical center line of each of the plurality of second pad points.

9. The electrode structure of claim 1, wherein the distance between the second bulbar and the second edge ranges from 0.01 mm to 3 mm.

10. The electrode structure of claim 9, wherein the distance between each of the plurality of second pad points and the second edge ranges from 1 mm to 20 mm.

11. A back contact cell, comprising the electrode structure of claim 1 and a backlight surface, wherein the electrode structure is disposed on the backlight surface of the back contact cell.

12. A back contact cell module, comprising the back contact cell of claim 11.

13. A back contact cell system, comprising the back contact cell module of claim 12.

* * * * *